(12) United States Patent
Cheng et al.

(10) Patent No.: US 8,009,387 B2
(45) Date of Patent: Aug. 30, 2011

(54) FORMING AN ALUMINUM ALLOY OXYNITRIDE UNDERLAYER AND A DIAMOND-LIKE CARBON OVERCOAT TO PROTECT A MAGNETIC RECORDING HEAD AND/OR MEDIA

(75) Inventors: Shide Cheng, Fremont, CA (US); Zhu Feng, Pleasanton, CA (US); Ellis T. Cha, San Ramon, CA (US)

(73) Assignee: SAE Magnetics (HK) Ltd., Shatin, N.T. (HK)

( * ) Notice: Subject to any disclaimer, the term of this patent is extended or adjusted under 35 U.S.C. 154(b) by 0 days.

(21) Appl. No.: 12/804,935

(22) Filed: Aug. 2, 2010

(65) Prior Publication Data

US 2010/0307911 A1 Dec. 9, 2010

Related U.S. Application Data

(62) Division of application No. 11/655,025, filed on Jan. 18, 2007, now Pat. No. 7,782,569.

(51) Int. Cl.
*G11B 5/82* (2006.01)
*B01J 19/12* (2006.01)
*B05D 5/12* (2006.01)
*C23C 16/00* (2006.01)
*H04R 31/00* (2006.01)

(52) U.S. Cl. ..................... 360/135; 360/235.2; 427/130; 427/249.7; 427/530; 427/532; 427/551; 427/553; 204/157.41; 204/157.43; 204/157.44; 204/192.11; 29/603.13

(58) Field of Classification Search .......... 360/131–136, 360/235.2; 204/157.41, 157.43, 157.44, 204/192.11; 29/603.13; 427/130, 249.7, 427/530, 532, 551, 553
See application file for complete search history.

(56) References Cited

U.S. PATENT DOCUMENTS 4,861,669 A 8/1989 Gillery
4,952,904 A 8/1990 Johnson et al.
5,070,036 A 12/1991 Stevens
(Continued)

FOREIGN PATENT DOCUMENTS

DE 19730884 1/1999
(Continued)

OTHER PUBLICATIONS

Y. Liu et al., "Effects of mechanical stress on the resistance of TMR devices,", Journal of Magnetism and Magnetic Materials (2006), doi: 10.1016/j.jmmm.2006.10.969, 3 pages.

(Continued)

*Primary Examiner* — A. J. Heinz
(74) *Attorney, Agent, or Firm* — Saile Ackerman LLC; Stephen B. Ackerman (57) ABSTRACT

A method for forming a protective bilayer on a magnetic read/write head or magnetic disk. The bilayer is formed as an adhesion enhancing underlayer and a protective diamond-like carbon (DLC) overlayer. The underlayer is formed of an aluminum or alloyed aluminum oxynitride, having the general formula $AlO_xN_y$ or $Me_zAlO_xN_y$, where $Me_z$ symbolizes $Ti_z$, $Si_z$ or $Cr_z$ and where x, y and z can be varied within the formation process. By adjusting the values of x and y the adhesion underlayer contributes to such qualities of the protective bilayer as stress compensation, chemical and mechanical stability and low electrical conductivity. Various methods of forming the underlayer are provided, including reactive ion sputtering, plasma assisted chemical vapor deposition, pulsed laser deposition and plasma immersion ion implantation.

38 Claims, 5 Drawing Sheets

U.S. PATENT DOCUMENTS

| | | | |
|---|---|---|---|
| 5,227,196 A | 7/1993 | Itoh | |
| 5,609,948 A | 3/1997 | David et al. | |
| 6,238,803 B1 | 5/2001 | Fu et al. | |
| 6,296,742 B1 | 10/2001 | Kouznetsov | |
| 6,517,956 B1 | 2/2003 | Chen | |
| 6,569,295 B2 | 5/2003 | Hwang et al. | |
| 6,915,796 B2 | 7/2005 | Sung | |
| 7,091,541 B2 | 8/2006 | Natsume et al. | |
| 7,097,745 B2 * | 8/2006 | Hoehn et al. | 204/192.34 |
| 7,300,556 B2 | 11/2007 | Hwang et al. | |
| 7,465,378 B2 | 12/2008 | Nyberg et al. | |
| 7,722,968 B2 | 5/2010 | Ishiyama | |

FOREIGN PATENT DOCUMENTS

| | | |
|---|---|---|
| JP | 2182880 | 7/1990 |
| JP | 2215522 | 8/1990 |
| JP | 3195301 | 8/1991 |
| JP | 4235283 | 8/1992 |
| JP | 11268164 | 10/1999 |

OTHER PUBLICATIONS

"Growth dynamics of aluminum nitride and aluminum oxide thin films synthesized by ion-assisted deposition," by R. P. Netterfield et al., Journal of Applied Physics vol. 63, No. 3, Feb. 1, 1988, pp. 760-769, 1988 American Institute of Physics.

"Reactive ion assisted deposition of aluminum oxynitride thin films," by Chang Kwon Hwangbo et al., Jul. 15, 1989, vol. 28, No. 14, Applied Optics, pp. 2779-2784.

"Reaction of N2 beams with aluminum surfaces," by J. Ahley Taylor et al., Journal of Che. Phys. Vol. 75, No. 4, Aug. 14, 1981, pp. 1735-1745, 1981 American Institute of Physics.

"Control of reactive sputtering processes," by W.D. Sproul et al., Thin Solid Films 491 (2005) 1-17, 2005 Elsevier B. V., doi: 10.1016/j.tsf.2005.02.022.

Handbook of Plasma Immersion Ion Implantation and Deposition, Edited by Andre Anders, Copyright 2000, John Wiley & Sons, Inc. NY, 20 pages.

* cited by examiner

| Physical property of related materials | Melting point (°C) | Thermal expansion coefficient ($10^{-6}/°C$) | Electrical resistivity (Ohm-cm) | Elastic modulus (GPa) | Hardness (GPa) |
|---|---|---|---|---|---|
| $Al_2O_3$ | 2050 | 7.0 | $>10^{11}$ | 170-530 | 21-25 |
| AlN | 2572 | 5.0 | $>10^{11}$ | 270-340 | 12 |
| DLC | 3500 | 1-2 | $10^6$-$10^{11}$ | 100-340 | 10-60 |
| α-Si | 1210 | 2.8 | $10^{-5}$-$10^{10}$ | - | - |
| AlTiC | - | 7.9 | $10^6$-$10^{11}$ | 380 | - |
| $Ni_{80}Fe_{20}$ | 1315 | 12.2 | $55 \times 10^{-6}$ | 207 | - |

FORMING AN ALUMINUM ALLOY OXYNITRIDE UNDERLAYER AND A DIAMOND-LIKE CARBON OVERCOAT TO PROTECT A MAGNETIC RECORDING HEAD AND/OR MEDIA

This is a Divisional Application of U.S. patent application Ser. No. 11/655,025 filed on Jan. 18, 2007, now U.S. Pat. No. 7,782,569, which is herein incorporated by reference in its entirety and assigned to a common assignee.

BACKGROUND OF THE INVENTION

1. Field of the Invention

This invention relates to the fabrication of hard disk drives (HDD), particularly to a method of protecting a magnetic head and magnetic disks by use of a diamond-like carbon coating on an underlayer that also serves as a corrosion barrier.

2. Description of the Related Art

Reducing the head-to-disk spacing (fly height) between a magnetic read/write head and the surface of a magnetic disk rotating beneath it has been one of the major approaches in achieving ultra-high recording density in a hard disk drive (HDD) storage system. For a commercially available HDD with 160 GBytes capacity, the fly height is on the order of 10 nanometers (nm). Maintaining such a small spacing between a rapidly spinning disk and a read/write head literally flying above it is difficult and an occasional contact between the disk surface and the head is unavoidable. Such contact, when it does occur, can lead to damage to the head and the disk and to the loss of recorded information on the disk. To minimize the head and disk damage, a thin layer of DLC (diamond-like carbon) coating is applied to both the surface of the head and the surface of the disk. This DLC also serves to protect the magnetic materials in the head from corrosion by various elements within the environment. Given the importance of the role of the DLC, it is essential that it is hard, dense and very thin, the thinness being required to satisfy the overall fly height requirement while not using up any of the allotted spacing. Currently a DLC coating between 20-30 angstroms is found in the prior art.

Conventionally, DLC coating thicknesses are greater than 50 Å and for that thickness range, there is a high degree of internal stress, leading to poor adhesion with the substrate materials of the head as well as to other substrates to which they may be bonded. Because of high internal stress and thermal stress, an underlayer is required. For example, in applications of cutting edges and drilling tools, the DLC thickness is in the micron range, and the working temperature can go up to a few hundreds degrees Celsius. Thus, the coefficient of thermo expansion (CTE) of the underlayer also plays an important role. For these reasons, in prior arts, Japanese Patents JP 2571957, JP2215522 and JP3195301 have proposed Si, $SiO_x$, SiC and $SiN_x$ for this adhesion layer. Itoh et al. (U.S. Pat. No. 5,227,196) discloses a $SiN_x$ underlayer on an oxide substrate beneath the DLC layer. Various other types of adhesion layers are also found in the prior arts. Ishiyama (US Patent Application 2006/0063040) discloses a carbon-based protection layer of hydrogenated carbon nitride for better adhesion. Hwang et al. (US Patent Application 2005/0045468) teaches a Si underlayer for a DLC. Hwang et al. (US Patent Application 2002/0134672) discloses Si, $Al_2O_3$, $SiO_2$, or $SiN_x$ as an underlayer beneath a DLC layer. David et al. (U.S. Pat. No. 5,609,948) describes a SiC underlayer under a DLC layer.

In addition to this cited prior art, adhesion layers comprising materials other than Si have also been utilized in other areas. Natsume et al. (U.S. Pat. No. 7,091,541) discloses the oxynitride TiAlON for an underlayer between a capacitor dielectric layer and an electrode. Fu et al. (U.S. Pat. No. 6,238,803) shows a $TiO_xN_y$ barrier layer for an Al electrode. Johnson et al. (U.S. Pat. No. 4,952,904) describes a metal oxide underlayer between silicon nitride and platinum. Stevens (U.S. Pat. No. 5,070,036) shows metal oxynitride as one of various material regions in a VLSI circuit. Gillery (U.S. Pat. No. 4,861,669) shows a $TiO_xN_y$ dielectric film.

For magnetic heads, the underlayer should have at least the following properties:

1. Electrical isolation property. For magnetic heads, electrical isolation must be provided for the magnetic metal alloy layers, such as those layers comprising a magnetoresistive read head based on the giant magnetoresistance (GMR) effect, or those layers comprising a device based on the tunneling magnetoresistive (TMR) effect. Electrical short circuits between these layers and surrounding HDD components will damage the head or similar device. For this reason, the protection layers, especially the underlayer, should be insulating or semi-insulating. However, due to the semiconductor properties of Si, the surface shunting of a Si underlayer can introduce noise, such as the so-called popcorn noise, into the GMR or TMR reader.

2. Anti-corrosion property. DLC films, particularly those produced through the filtered cathodic vacuum arc (FCVA) process of the prior art, are often embedded with micro- or nano-particles. These particles can result in pinholes and corrosion of the materials used in forming the magnetically active layers, such as NiFe and NiCoFe. The anti-corrosion property of the underlayer is therefore of crucial importance to maintaining the performance integrity of the sensor.

3. Anti-wear property. With the total thickness of the underlayer and the DLC layer being reduced to the sub-30 angstrom range, literally every atom counts for the protection. Thus, a better anti-wear property is expected if we can put more atoms in the limited film thickness. It is therefore very important that the underlayer have both chemical stability for corrosion protection and high hardness for tribological advantage.

It is the purpose of the present invention to provide a new class of materials as underlayers to replace the Si and related materials described in the prior art cited above and to provide the above properties.

SUMMARY OF THE INVENTION

The first object of the present invention is to provide a thin protective layer for a magnetic read/write head or a magnetic recording medium to protect them from adverse effects of inadvertent mutual contact and to provide wear resistance between the head and the medium surface.

The second object of the present invention is to provide such a protective layer formed as a bilayer, wherein an overlayer is primarily a protective layer and an underlayer is primarily an adhesion enhancing layer and a corrosion protection layer.

The third object of the present invention is to provide such a bilayer wherein inherent high resistivity of the underlayer eliminates surface shunting, thereby reducing noise, such as popcorn noise, from the read/write head.

A fourth object of the present invention is to provide such a bilayer wherein the underlayer forms a strong and stable chemical bond with the overlayer.

A fifth object of the present invention is to provide methods for forming a protective bilayer that satisfies all of the above objects.

The objects of this invention will be achieved by the use of a class of materials, the aluminum oxynitrides and alloyed aluminum oxynitrides, exemplified by $AlO_xN_y$, $Ti_zAlO_xN_y$, $Si_zAlO_xN_y$, or $Cr_zAlO_xN_y$ and more generally symbolized $Me_zAlO_xN_y$ where Me signifies an alloying metal. When the $AlO_xN_y$, $Ti_zAlO_xN_y$, $Si_zAlO_xN_y$, and $Cr_zAlO_xN_y$ are formed as underlayers, they can be deposited on a read/write head or a magnetic disk by sputtering, plasma immersion ion implantation (PIII), plasma immersion ion implantation deposition (PIIID), plasma enhanced chemical vapor deposition (PECVD), reactive pulsed laser deposition (PLD), etc.

The aluminum oxynitrides and alloyed aluminum oxynitrides shown above are carbide forming compounds that exhibit good adhesion to DLC films. In addition, they have also been shown to have good adhesion to substrate materials used in magnetic read heads, such as AlTiC, $Al_2O_3$, NiFe and NiFeCo and to a variety of other materials extensively used in the semiconductor industry, such as Ti, Cr and Ta and others of a comparable nature.

The aluminum oxynitrides are also very good materials in terms of their stability, chemical inertness, and the tunability (by variation of their oxygen and nitrogen contents) of physical and chemical properties such as stress, refractive index, and density, etc. For example, the hardness of $AlO_xN_y$ can be tuned from 12 GPa (AlN) to more than 20 GPa ($Al_2O_3$). In the case of $Al_{23}O_{27}N_5$, it hardness is about 18 GPa. One of the most important functionalities of the protection films is corrosion resistance and, as compared to silicon or amorphous silicon, $Al_2O_3$ and AlN are more stable and corrosion resistant.

The introduction of titanium, silicon, and chromium into the Al—O—N system (i.e. $Ti_zAlO_xN_y$, $Si_zAlO_xN_y$, $Cr_zAlO_xN_y$), can also provide extra hardness. For example the hardness of TiAlN can be 50% higher than AlN. In addition, the introduction of titanium and chromium can also promote the bonding strength with diamond like carbon layer through forming Ti—C or Cr—C bonds and to promote the adhesion to DLC films. Ti, Cr, and Al have been widely used as bonding elements for diamond particles (U.S. Pat. No. 6,915,796). In the meantime, due to the good adhesion of aluminum, titanium and chromium, these films have good adhesion to the substrate materials in a magnetic head, including AlTiC, $Al_2O_3$, NiFe, NiFeCo, etc.

The formation of strong Ti—C and Cr—C bonds will promote adhesion of an $AlO_xN_y$ underlayer to a DLC overcoat by adding Ti or Cr components to $AlO_xN_y$, in the meantime, metal components in the underlayer will adhere to the substrate material in the slider or media, namely, AlTiC, $Al_2O_3$, NiFe, NiFeCo, etc.

The $AlO_xN_y$, $Ti_zAlO_xN_y$, $Si_zAlO_xN_y$, $Cr_zAlO_xN_y$ underlayer can be prepared by reactive sputtering of metal, metal oxide or metal nitride targets within an $Ar/O_2/N_2$ atmosphere or treated by $Ar/O_2$ and/or $Ar/N_2$ plasmas generated via different methods, such as ion beam plasma, capacitively coupled plasma (CCP), inductively coupled plasma (ICP), or electron cyclotron resonance (ECR) plasma.

Preferred embodiments describing methods and examples of depositing an $AlO_xN_y$, $Ti_zAlO_xN_y$, $Si_zAlO_xN_y$, or $Cr_zAlO_xN_y$ underlayer will be given below and illustrated below. In each of these embodiments and examples a vacuum deposition chamber that can be pumped down to $<10^{-6}$ Torr base pressure will be utilized. An ion source powered by an automatically matched RF power supplier, such as a source that generates an Ar+ beam, is focused onto the target. The sputtered target is deposited through its plume on a substrate, which can be a magnetic disk or a read/write head, and which is in continuous rotation to achieve good uniformity of the deposition. Ar, $O_2$ and $N_2$ gases are introduced into the chamber/ion source through gas lines.

Normally, oxygen is more reactive than nitrogen; in addition, oxygen gas is more easily decomposed into atoms than nitrogen gas. These facts are very important in the control of the gas flow and atmosphere in the deposition systems, in order to obtain appropriate composition of $AlO_xN_y$, $Ti_zAlO_xN_y$, $Si_zAlO_xN_y$, or $Cr_zAlO_xN_y$ films.

Figure 1:
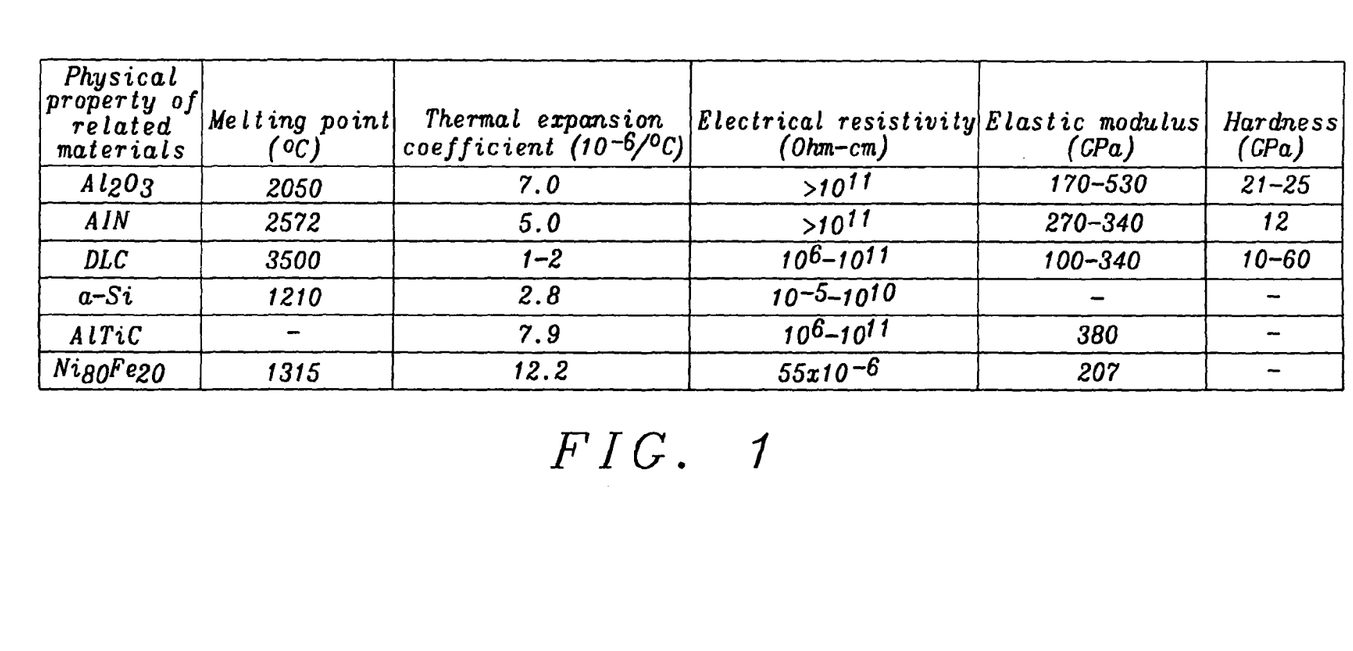
FIG. 1 is a table listing several relevant properties of materials used in forming the read/write head and its protective coatings.
Figure 2A:
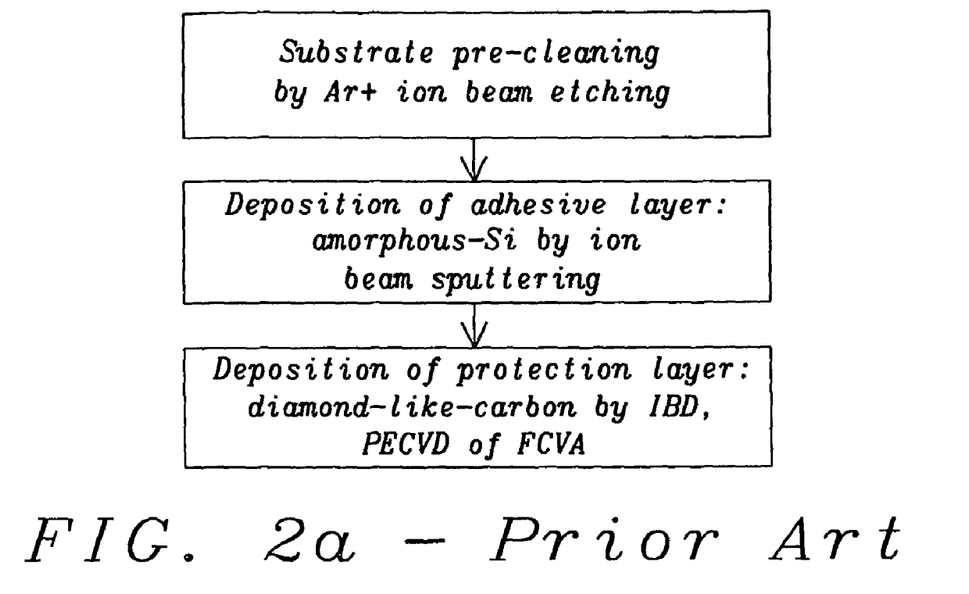
FIGS. 2a and 2b are flow charts of the prior art method of forming a protective bilayer (2a) and the present method of forming the protective bilayer (2b).
Figure 2B:
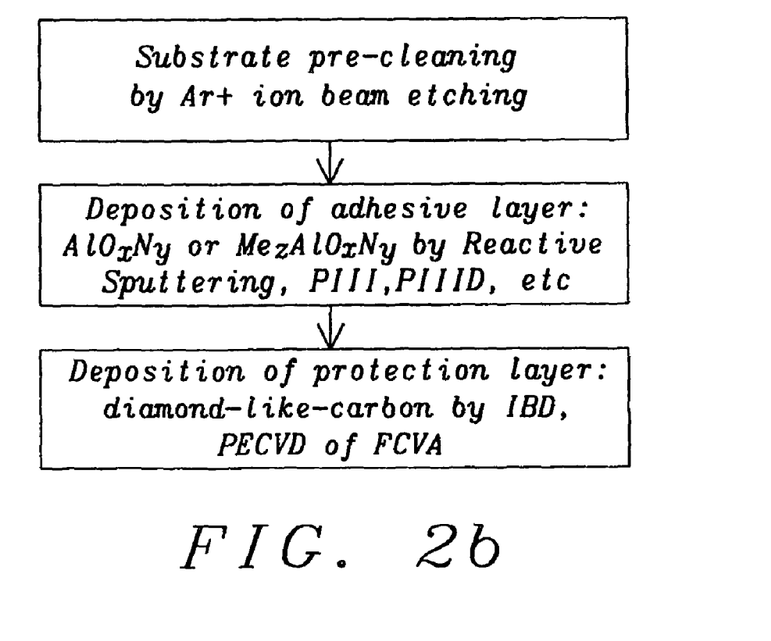

For reference and comparison purposes, FIG. 1 provides a convenient listing of several relevant mechanical and electrical properties of various materials that are used in the fabrication of a magnetic read/write head.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein.

DESCRIPTION OF THE PREFERRED EMBODIMENTS

Each of the preferred embodiments of the present invention teach a method of fabricating a thin protective bilayer over a magnetic read/write head or recording media wherein the protective bilayer comprises an adhesion enhancing underlayer formed as an aluminum oxynitride, $AlO_xN_y$, $Ti_zAlO_xN_y$, $Si_zAlO_xN_y$, $Cr_zAlO_xN_y$ (more generally $Me_zAlO_xN_y$), over which is formed a hard, protective diamond-like carbon (DLC) overlayer (also referred to as an overcoat).

Amorphous Si (a-Si) is widely used as an underlayer in the magnetic recording industry to promote the adhesion of a DLC layer to the substrate of a magnetic read/write head. In the prior art, the coating process begins with the cleaning of the head substrate using an Ar+ ion beam. Following this cleaning process, an underlayer of amorphous Si is deposited using ion-beam sputtering (IBD) and then a DLC overlayer is deposited using ion-beam deposition (IBD), PECVD or ECR, more preferably, filtered cathodic vacuum arc (FCVA).

The preferred embodiments of the present invention differ from the IBD deposition of a-Si because a totally different class of materials, the aluminum oxynitrides, and alloyed aluminum oxynitrides are formed as the adhesion layer. In the preferred embodiments the underlayer is formed as a layer that is deposited by reactive ion sputtering, plasma enhanced chemical vapor deposition (PECVD), reactive pulsed laser deposition (PLD) and other methods to be described below.

Figure 3:
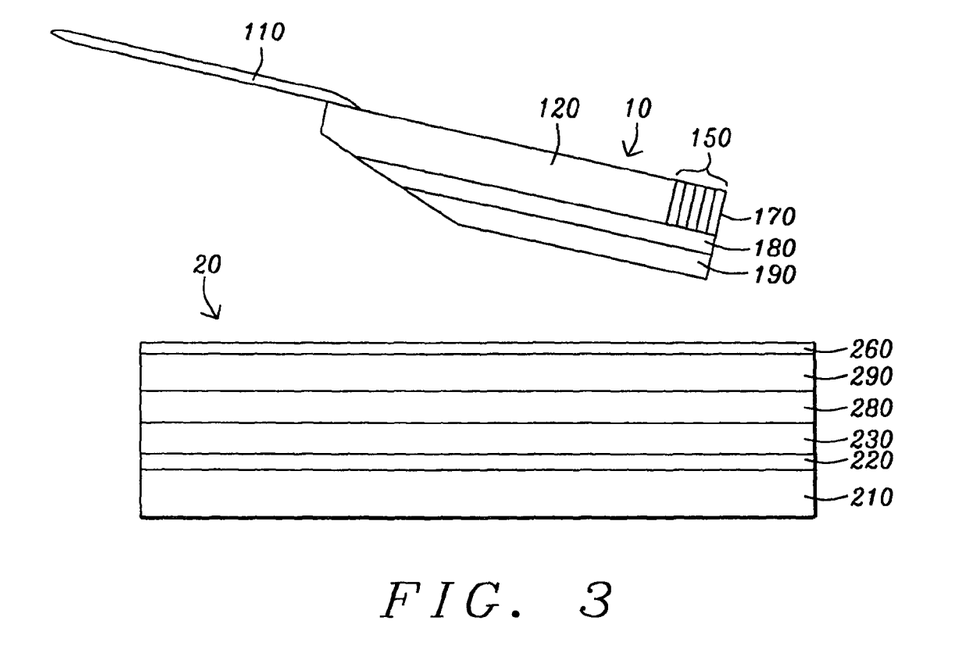
FIG. 3 is a schematic illustration of a slider mounted read/write head of the type on which the protective bilayer of the present invention is to be formed. The slider flies above a rotating magnetic disk of the type also protected by the bilayer of the present invention.

Referring to FIG. 3a, there is shown, in flow chart form, a sequence of three steps that produces the protective bilayer of the prior art.
1. Substrate pre-cleaning using an $Ar^+$ ion beam or $Ar/O_2$ ion beam as an etching mechanism.
2. Deposition of an adhesion underlayer of amorphous silicon (a-Si) using reactive ion sputtering.
3. Deposition of a protective overlayer of DLC, using IBD, PECVD or FCVA.

Referring to FIG. 3b, there is shown a sequence of three steps that produces the protective bilayer of the present invention.
1. Substrate pre-cleaning using an $Ar^+$ ion beam or $Ar/O_2$ as an etching mechanism.
2. Deposition of an adhesion underlayer of aluminum oxynitride using reactive ion sputtering of an aluminum oxide or nitride target within an $Ar/O_2/N_2$ atmosphere or by using plasma immersion ion implantation, plasma immersion ion implantation deposition, plasma enhanced chemical vapor deposition, or reactive pulsed laser deposition.
3. Deposition of a protective overlayer of DLC, using IBD, PECVD or FCVA.

The following embodiments of the present invention are all methods by which a protective layer can be formed on a magnetic read/write head or a magnetic recording media (e.g. a disk) that will meet all the objects of the invention set forth above. In all of the embodiments, the protective layer is formed as a bilayer on the disk or on an appropriate substrate surface of the read/write head, such as an air-bearing layer surface (ABS) that has been cleaned by an appropriate method such as $Ar^+$ beam or $Ar/O_2$ ion beam etching. It is also understood that there is preferably a plurality of read/write heads mounted on a holder and simultaneously treated by the method.

Figure 4:
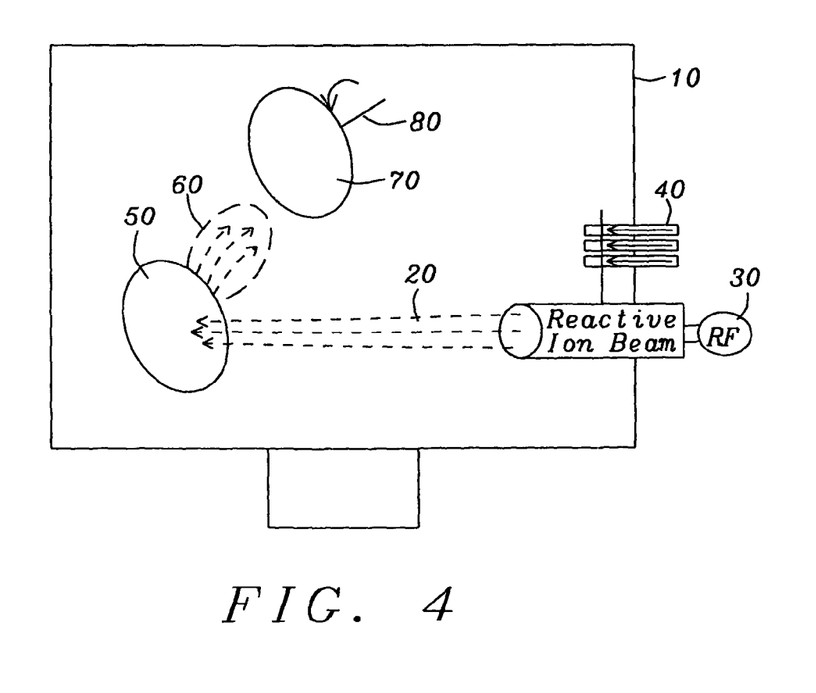
FIG. 4 is a schematic illustration of an apparatus for producing particular preferred embodiments of the invention using reactive ion beam sputtering.

FIG. 4 illustrates a magnetic head-disk interface (not drawn to scale), where a magnetic head slider (10) is mechanically attached to its suspension (110). The slider is built on AlTiC substrate (120) with an incorporated shielded GMR or TMR reader and writer (150) and an $Al_2O_3$ overcoat (170). The reader shield, the reader, and writer materials are mainly formed of magnetic materials comprising various alloys and compounds of Ni—Fe—Co which are subject to corrosion when exposed to environmental conditions. The slider is coated with an underlayer (180) and DLC overcoat (190).

On the other hand, the magnetic disk (20) is built on a glass or aluminum substrate (210) on top of which is an underlayer (220) and a magnetic layer (230). The surfaces of the magnetic layer is protected by the underlayer (280) and DLC overcoat (290) formed by the method of the present invention. To minimize the abrasion with the slider head, a lube (lubricant) layer (260) is applied on the magnetic disk. The present invention provides the underlayer for both the slider (180) and for the magnetic disk (280).

First Preferred Embodiment

Figure 5:
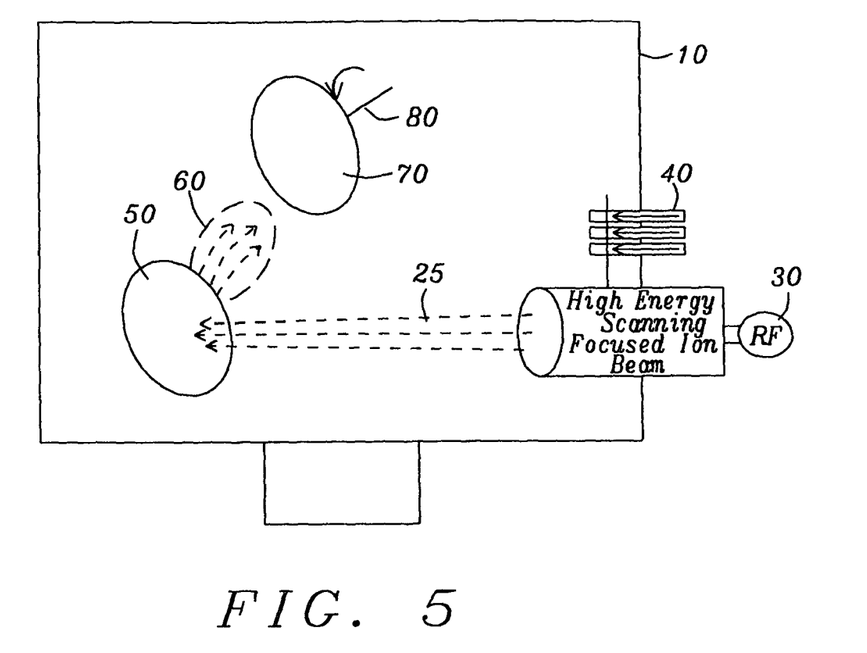
FIG. 5 is a schematic illustration of an apparatus for producing particular preferred embodiments of the invention using a scanned focused ion beam.

Referring now to FIG. 5, there is shown a schematic perspective drawing of an apparatus within which the protective bilayer of the present invention can be formed on a magnetic read/write head or on the surface of a magnetic recording disk. In this first preferred embodiment, as an example of the method of reactive ion sputtering, the adhesion enhancing layer will be formed as a layer of $AlO_xN_y$.

The first preferred embodiment of this invention uses a deposition chamber (10) in which a vacuum of less than approximately $10^{-6}$ Torr has been formed by a turbo pump. This chamber is substantially a common element in all of the following embodiments. Into this chamber an ion beam, such as an $Ar^+$ beam (20) is injected and directed at a target of $Al_2O_3$ (50). The beam is produced by a RF source (30) and accelerated by voltages that range from approximately 300 V to 1200 V. Injection ports (40) allow the injection of $O_2$ and $N_2$ gases into the chamber (10) with flow rates between approximately 0 and 20 sccm, and different ratios for reactive deposition, depending upon the desired form of the $AlO_xN_y$ underlayer, with x within the range of approximately 0 to 1.5 and y within the range of approximately 0 to 1. As noted above, the $Ar^+$ beam is directed at a target of $Al_2O_3$ (50) and the sputtered atoms (60) impinge on the device being coated (70), which can consist of read/write heads or magnetic disks, a plurality of which are mounted on a rotatable holder (80) that can be rotated for uniformity of the deposition. In all the formations of embodiments one through seven an overall thickness of the underlayer that does not exceed 50 angstroms produces results that meet the objects of the invention. An underlayer thickness that is less than 20 angstroms is most preferable although adhesion layers less than 50 angstroms in thickness will meet the objects of the invention. Subsequent to the deposition of the adhesion layer, a layer of DLC (not shown) is formed on the underlayer using the methods cited above to produce a bonded bilayer that meets the objects of the invention.

In a second version of the same first embodiment, the apparatus of FIG. 5 is used as above, but the target material (50) is AlN, the Al nitride rather than the Al oxide. The $Ar^+$ beam (20) is injected using an RF source and accelerating voltages between approximately 300 V and 1200 V and the $O_2$ and $N_2$ gases are injected into the chamber (10) with flow rates between approximately 0 and 20 sccm, and different ratios depending upon the desired form of the $AlO_xN_y$ underlayer, with x within the range of approximately 0 to 1.5 and y within the range of approximately 0 to 1. As the $Ar^+$ beam strikes the target of AlN (50) the resulting sputtered Al and N atoms (60) impinge on the read/write heads or disks (70) in the presence of the injected $O_2$ and $N_2$ gases to produce the desired $AlO_xN_y$ adhesion layer. A plurality of the read/write heads or a magnetic disk are mounted on a rotatable holder (80) for uniformity of the deposition.

It is also noted that x and y can be varied as the deposition process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

Subsequent to the formation of the underlayer, a DLC overlayer is formed on the underlayer using methods cited above.

Second Preferred Embodiment

Figure 6:
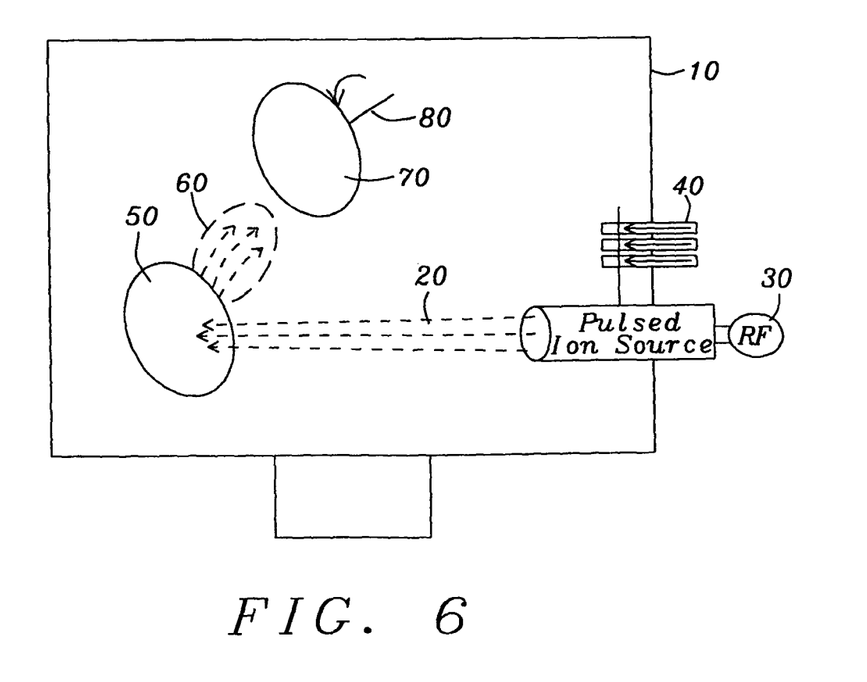
FIG. 6 is a schematic illustration of an apparatus for producing particular preferred embodiments of the invention using a pulsed ion beam.

The second preferred embodiment of this invention uses the apparatus of FIG. 6, which is similar to that of FIG. 5 in that it comprises a deposition chamber (10) into which a reactive ion beam (20), such as an $Ar^+$ ion beam, can be injected and directed at an Al target (50), while injection ports (40) allow the injection of $O_2$ and $N_2$ gases with flow rates between approximately 0 and 20 sccm, and different ratios, in order to form desired form of the $AlO_xN_y$ underlayer with x within the range of approximately 0 to 1.5 and y within the range of approximately 0 to 1. In this embodiment, however, the reactive ion beam is a high energy scanning, focused $Ar^+$ ion beam (25) that is directed at a target of Al (50) and the sputtered atoms (60) impinge on the target read/write heads or a magnetic disk (70), which are mounted on a rotatable holder (80) for uniformity of the deposition. To avoid poisoning the target and to eliminate hysteresis effects associated with the deposition, there is used a high energy scanning focused ion beam as described by T. Nyberg et al. (US Patent Application 2004/0149566A1) which is incorporated by reference here in its entirety. It is also noted that x and y can be varied as the deposition process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

As a second example of the method of this embodiment, all of the above described conditions remain substantially identical, but a target (50) of $Ti_zAl$ alloy (more generally $Me_zAl$ where Me hereinafter symbolizes an appropriate alloying metal) is provided for the focused, scanning reactive ion beam and the sputtering process thereby produces an underlayer of $Ti_zAlO_xN_y$ on either a read/write head or a magnetic disk. The sputtering process is still produced by the method of Nyberg described above and incorporated herein. The oxygen and nitrogen gases are introduced with different ratios, in order to form film composition of $Ti_zAlO_xN_y$ with x in the range of approximately 0 to 1.5+2z, y in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a third example of the method of this embodiment, all of the above described conditions remain substantially identical, but a target (50) of $Si_zAl$ alloy is provided for the focused, scanning reactive ion beam and the sputtering process thereby produces an underlayer of $Si_zAlO_xN_y$ on either a read/write head or a magnetic disk. The sputtering process is still produced by the method of Nyberg described above and incorporated herein. The oxygen and nitrogen gases are introduced with different ratios, in order to form film composition of $Si_zAlO_xN_y$ with x in the range of approximately 0 to 1.5+2z, y is in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a fourth example of the method of this embodiment, all of the above described conditions remain substantially identical, but a target (50) of $Cr_zAl$ alloy is provided for the focused, scanning reactive ion beam and the sputtering process thereby produces an underlayer of $Cr_zAlO_xN_y$ on either a read/write head or a magnetic disk. The sputtering process is still produced by the method of Nyberg described above and incorporated herein. The oxygen and nitrogen gases are introduced with different ratios, in order to form film composition of $Cr_zAlO_xN_y$ with x in the range of approximately 0 to 1.5+2z, y is in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

Subsequent to the formation of the underlayer, a DLC overlayer is formed on the underlayer using methods cited above.

Third Preferred Embodiment

Figure 7:
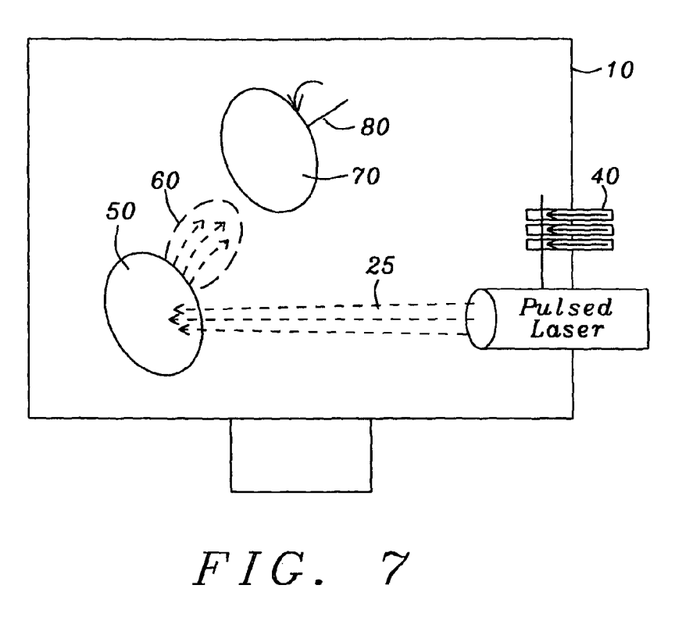
FIG. 7 is a schematic illustration of an apparatus for producing a preferred embodiment of the invention using a pulsed high energy laser.

The third preferred embodiment of this invention uses the apparatus of FIG. 7, which comprises a deposition chamber (10) into which a reactive ion beam, such as an $Ar^+$ ion beam can be injected and directed at an Al target (50) while injection ports (40) allow the injection of $O_2$ and $N_2$ gases with flow rates between approximately 0 and 20 sccm, and different ratios, depending upon the desired form of the $AlO_xN_y$ underlayer, with x within the range of approximately 0 to 1.5 and y within the range of approximately 0 to 1. In this embodiment, however, the ion beam (20) is a pulsed $Ar^+$ ion source with high instantaneous power, that is directed at a target of Al (50) and the sputtered atoms (60) impinge of the target read/write heads (70) or media, which are mounted on a rotatable holder (80) for uniformity of the deposition. To avoid poisoning the target and to eliminate hysteresis effects associated with the deposition, there is used a high instantaneous power pulsed ion source as described by V. Kousnetsov et al: (U.S. Pat. No. 6,296,742) which is incorporated by reference here in its entirety. It is also noted that x and y can be varied as the deposition process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

As a second example of the method of this embodiment, all of the above described conditions remain substantially identical, but a target (50) of $Ti_zAl$ alloy (more generally, $Me_zAl$) is provided for the pulsed reactive ion beam and the sputtering process thereby produces an underlayer of $Ti_zAlO_xN_y$ on either a read/write head or a magnetic disk. The sputtering process is still produced by the method of Kousnetsov described above and incorporated herein. The oxygen and nitrogen gases are introduced with different ratios, in order to form film composition of $Ti_zAlO_xN_y$ with x in the range of approximately 0 to 1.5+2z, y in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a third example of the method of this embodiment, all of the above described conditions remain substantially identical, but a target (50) of $Si_zAl$ alloy is provided for the focused, scanning reactive ion beam and the sputtering process thereby produces an underlayer of $Si_zAlO_xN_y$ on either a read/write head or a magnetic disk. The sputtering process is still produced by the method of Kousnetsov described above and incorporated herein. The oxygen and nitrogen gases are introduced with different ratios, in order to form film composition of $Si_zAlO_xN_y$ with x is in the range of approximately 0 to 1.5+2z, y in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a fourth example of the method of this embodiment, all of the above described conditions remain substantially identical, but a target (50) of $Cr_zAl$ alloy is provided for the pulsed reactive ion beam and the sputtering process thereby produces an underlayer of $Cr_zAlO_xN_y$ on either a read/write head or a magnetic disk. The sputtering process is still produced by the method of Kousnetsov described above and incorporated herein. The oxygen and nitrogen gases are introduced with different ratios, in order to form film composition of $Cr_zAlO_xN_y$, with x in the range of approximately 0 to 1.5+2z, y in the range of approximately 0 to 1+z. and z in the range of approximately 0 to 10. It is noted that the values of x, y and z can change with the layer thickness as the deposition is proceeding.

Subsequent to the formation of the underlayer, a DLC overlayer is formed on the underlayer using methods cited above.

Fourth Preferred Embodiment

Figure 8:
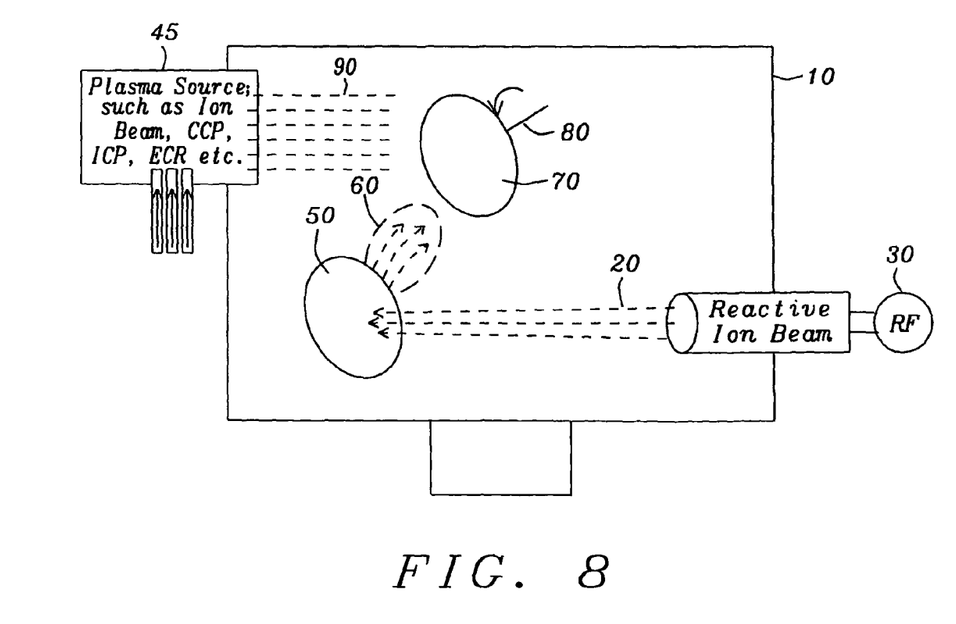
FIG. 8 is a schematic illustration of an apparatus for producing a preferred embodiment of the invention using an ion beam to sputter in the presence of a plasma.

The fourth preferred embodiment of this invention uses the apparatus of FIG. 8, which comprises a deposition chamber (10) into which a high energy pulsed laser can direct a beam of high energy, pulsed electromagnetic radiation (25) at an Al target (50) while injection ports (40) allow the injection of $O_2$ and $N_2$ gases with flow rates between 0 and 20 sccm, and different ratios, x/y, depending upon the desired form of the $AlO_xN_y$ underlayer. In this embodiment, the electromagnetic radiation can be produced by a high energy pulsed laser such as a $CO_2$ laser, an excimer laser, etc. and the atoms ejected (60) by the laser beam impinge of the target read/write heads or magnetic disks (70), which are mounted on a rotatable holder (80) for uniformity of the deposition. Values of x within the range of approximately 0 to 1.5 and y within the range of approximately 0 to 1, have produced adhesion layers meeting the objects of the invention. It is also noted that x and y can be varied as the deposition process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

As a second example of the method of this embodiment, all of the above described conditions remain substantially identical, but a target (50) of $Ti_zAl$ alloy (more generally, $Me_zAl$) is provided for the high energy laser beam and the sputtering process thereby produces an underlayer of $Ti_zAlO_xN_y$ on either a read/write head or a magnetic disk. The oxygen and nitrogen gases are introduced with different ratios, in order to form film composition of $Ti_zAlO_xN_y$ with x in the range of approximately 0 to 1.5+2z, y is in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a third example of the method of this embodiment, all of the above described conditions remain substantially identical, but a target (50) of $Si_zAl$ alloy is provided for the high energy laser and the sputtering process thereby produces an underlayer of $Si_zAlO_xN_y$ on either a read/write head or a magnetic disk. The oxygen and nitrogen gases are introduced with different ratios, in order to form film composition of $Si_zAlO_xN_y$ with x in the range of approximately 0 to 1.5+2z, y is in the range of approximately 0 to 1+z. and z in the range of approximately 0 to 10. The flow rates of the oxygen and nitrogen gases are the same as given above. It is noted that the values of x, y and z can change with the layer thickness as the deposition is proceeding.

As a fourth example of the method of this embodiment, all of the above described conditions remain substantially identical, but a target (50) of $Cr_zAl$ alloy is provided for the high energy laser and the sputtering process thereby produces an underlayer of $Cr_zAlO_xN_y$ on either a read/write head or a magnetic disk. The oxygen and nitrogen gases are introduced with different ratios, in order to form film composition of $Cr_zAlO_xN_y$ with x in the range of approximately 0 to 1.5+2z, y in the range of approximately 0 to 1+z. and z in the range of approximately 0 to 10. The flow rates of the oxygen and nitrogen gases are the same as given above.

Subsequent to the formation of the underlayer, a DLC overlayer is formed on the underlayer using methods cited above.

Fifth Preferred Embodiment

Referring to FIG. 8, there is shown a schematic perspective drawing of an apparatus within which there is carried out a two-step process of forming the protective bilayer on a magnetic read/write head in accord with a fifth preferred embodiment.

The fifth preferred embodiment of this invention uses the deposition chamber of FIG. 8 (10) into which a reactive ion beam such as an $Ar^+$ beam (20) is injected. The beam is produced by a RF source (30) and accelerated by voltages that range from 300 V to 1200 V. The beam (20) impinges on an Al target (50) or alloyed Al target ($Ti_zAl$, $Si_zAl$, $Cr_zAl$, or, more generally, $Me_zAl$) causing target atoms to be sputtered onto a plurality of magnetic read/write heads or magnetic disks (70) mounted on a rotatable holder (80) for uniform deposition.

After deposition of the sputtered film on the read/write heads, the film is then exposed to a plasma (90) of $Ar/O_2/N_2$ gases (Ar being used as the carrier gas) that is injected into the chamber (10) with different ratios x/y, depending upon the desired form of the oxynitride. When Al is used as the target, values of x within the range of approximately 0 to 1.5 and y within the range of approximately 0 to 1, have produced adhesion layers meeting the objects of the invention. It is also noted that x and y can be varied as the deposition process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

Subsequent to the formation of the underlayer, a DLC overlayer is formed on the underlayer using methods cited above.

Sixth Preferred Embodiment

The sixth preferred embodiment of this invention is substantially the same as the fifth embodiment, except that the injection of the plasma occurs while the sputtered beam strikes the read/write heads or disks. The embodiment uses the deposition chamber (10) of FIG. 8 into which a reactive ion beam such as an $Ar^+$ beam (20) is injected. The beam is produced by a RF source (30) and accelerated by voltages that range from 300 V to 1200 V. The beam (20) impinges on an Al target or an alloyed $Ti_zAl$, $Si_zAl$ or $Cr_zAl$ (more generally $Me_zAl$) target (50) causing target atoms to be sputtered onto a plurality of magnetic read/write heads or a magnetic disk mounted on a rotatable fixture for uniform deposition.

The deposition of the sputtered film on the read/write heads or the magnetic disk (70) is carried out in the presence of a plasma (90) of $O_2$ and $N_2$ gases (Ar can be used as a carrier gas) that is formed within the chamber (10) with different ratios, depending upon the desired form of the oxynitride.

When Al is used as the target, values of x within the range of approximately 0 to 1.5 and y within the range of approximately 0 to 1, have produced adhesion layers meeting the objects of the invention. It is also noted that x and y can be varied as the plasma process proceeds to produce adhesion layers with compositions that are a function of layer thickness. In all these formations an overall thickness of the layer that does not exceed 50 angstroms produces results that meet the objects of the invention. A layer thickness that is less than 20 angstroms is most preferable.

Subsequent to the formation of the underlayer, a DLC overlayer is formed on the underlayer using methods cited above.

Seventh Preferred Embodiment

The seventh preferred embodiment of this invention uses the deposition chamber (10) of FIG. 8, in which a vacuum of less than approximately $10^{-6}$ Ton has been formed by a turbo pump. Into this chamber a reactive ion beam, such as an $Ar^+$ beam (20) is injected and directed at a target of Al or an alloyed $Ti_zAl$, $Si_zAl$ or $Cr_zAl$ (more generally, $Me_zAl$) target (50). The beam is produced by a RF source (30) and accelerated by voltages that range from 300 V to 1200 V. The beam (20) impinges on target (50) to be sputtered onto a plurality of magnetic read/write heads or magnetic disks (70) mounted on a rotatable fixture for uniform deposition.

After deposition of the Al sputtered film or $Ti_zAl$, $Si_zAl$ or $Cr_zAl$ (more generally $Me_zAl$) films on the read/write heads, the deposited film is then sequentially exposed to a plasma (90) of $Ar/O_2/N_2$ gases (100) (or sequentially exposed to a plasma (90) of $Ar/O_2$ gases and $Ar/N_2$ gases (100)) with different durations of the exposure, depending upon the desired form of the $Me_zAlO_xN_y$ layer (i.e. plasma surface treatment of the already deposited $Me_zAl$ film). The plasma can be generated and applied by the use of any of a number of methods known in the art, such as plasma formation by an ion beam, formation and application of a capacitively coupled plasma (CCP), formation of an electron cyclotron resonance (ECR) plasma or formation and application of an inductively coupled plasma (ICP).

It is also noted that x and y can be varied as the deposition process proceeds to produce underlayers with compositions that are a function of layer thickness. In all these formations an overall thickness of the layer that does not exceed 50 angstroms produces results that meet the objects of the invention. A layer thickness that is less than 20 angstroms is most preferable.

Subsequent to the formation of the underlayer, a DLC overlayer is formed on the underlayer using methods cited above.

As is understood by a person skilled in the art, the preferred embodiments of the present invention are illustrative of the present invention rather than being limiting of the present invention. Revisions and modifications may be made to methods, processes, materials, structures, and dimensions through which is formed a protective bilayer, including an aluminum oxynitride underlayer or an alloyed aluminum oxynitride layer, on a magnetic read/write head or on the surface of a magnetic disk, while still providing such a protective bilayer, formed in accord with the present invention as defined by the appended claims.

What is claimed is:

1. A method of forming a protected read/write head, a plurality of protected read/write heads or a surface protected magnetic disk comprising:
    providing the magnetic disk, the read/write head or the plurality thereof;
    cleaning appropriate surfaces of the disk, the read/write head or the plurality thereof;
    forming on said surfaces an Al or TiAl or SiAl or CrAl oxynitride adhesion underlayer; and
    forming on said underlayer a DLC layer.

2. The method of claim 1 wherein said underlayer is formed by a process comprising:
    providing a vacuum deposition chamber that includes a rotatable holder, a sputtering target, an apparatus for injecting a beam of reactive ions at a chosen energy, and directing said ions at said sputtering target, an apparatus for injecting various gases at chosen flow rates and maintaining said gases at desired relative concentrations within said chamber;
    mounting said read/write head, said plurality of such heads or said magnetic disk on said holder and rotating said holder;
    directing said reactive ions at a sputtering target;
    injecting $O_2$ gas and $N_2$ gas at a relative concentration ratio x/y while said reactive ions are impinging on said sputtering target, thereby forming said underlayer as an oxynitride on said read/write head, plurality thereof or magnetic disk.

3. The method of claim 2 wherein the target comprises Al, an oxide of Al, or a nitride of Al and x is in the range between approximately 0 and 1.5 and y is in the range between approximately 0 and 1.0 and the oxynitride is of the form $AlO_xN_y$.

4. The method of claim 2 wherein the target comprises an alloy of Al in the form $Me_zAl$ where Me is an alloying component, or the target comprises an oxide of $Me_zAl$ or a nitride of $Me_zAl$ and the oxynitride is of the form $Me_zAl\,O_xN_y$.

5. The method of claim 4 wherein $Me_z$ is $Ti_z$ and x is in the range between approximately 0 to 1.5+2z, and y is in the range between approximately 0 to 1+z. and z is in the range between approximately 0 to 10.

6. The method of claim 4 wherein $Me_z$ is $Si_z$ and x is in the range between approximately 0 and 1.5+2z, y is in the range between approximately 0 and 1+1.3z. and z is in the range between approximately 0 to 10.

7. The method of claim 4 wherein $Me_z$ is $Cr_z$ and x is in the range between approximately 0 to 1.5+2z, y is in the range between approximately 0 to 1+1.3z. and z is in the range between approximately 0 to 10.

8. The method of claim 2 wherein said $O_2$ and $N_2$ gases are injected at flow rates between 0 and 20 sccm.

9. The method of claim 2 wherein said ion beam is a beam of $Ar^+$ ions formed by sending said beam through a voltage of between approximately 300V to 1200V.

10. The method of claim 2 wherein x and y are made to vary as said underlayer is being formed.

11. The method of claim 1 wherein said underlayer is formed by a process comprising:
    providing a vacuum deposition chamber that includes a rotatable holder, a sputtering target, an apparatus for injecting a high energy pulsed ion beam or a focused, scanning beam of high energy ion beam into said chamber, and directing said ions at said sputtering target, an apparatus for injecting various gases at chosen flow rates and maintaining said gases at desired relative concentrations within said chamber;
    mounting said read/write head, said plurality of such heads or said magnetic disk on said holder and rotating said holder;
    directing said reactive ions at said sputtering target;
    injecting $O_2$ gas and $N_2$ gas at a relative concentration ratio while said reactive ions are impinging on said target, thereby forming said underlayer as an oxynitride on said read/write head, said plurality thereof or said magnetic disk.

12. The method of claim 11 wherein the target comprises Al, an oxide of Al, or a nitride of Al and x is in the range between approximately 0 and 1.5 and y is in the range between approximately 0 and 1.0 and the oxynitride is of the form $AlO_xN_y$.

13. The method of claim 11 wherein the target comprises an alloy of Al in the form $Me_zAl$ where $Me_z$ is an alloying component, or the target comprises an oxide of $Me_zAl$ or a nitride of $Me_zAl$ and the oxynitride is of the form $Me_zAl\,O_xN_y$.

14. The method of claim 13 wherein $Me_z$ is $Ti_z$ and x is in the range between approximately 0 to 1.5+2z, and y is in the range between approximately 0 to 1+z. and z is in the range between approximately 0 to 10.

15. The method of claim 13 wherein Me is Si and x is in the range between approximately 0 and 1.5+2z, y is in the range between approximately 0 and 1+1.3z. and z is in the range between approximately 0 to 10.

16. The method of claim 13 wherein $Me_z$ is $Cr_z$ and x is in the range between approximately 0 to 1.5+2z, y is in the range between approximately 0 to 1+1.3z. and z is in the range between approximately 0 to 10.

17. The method of claim 11 wherein said $O_2$ and $N_2$ gases are injected at flow rates between 0 and 20 sccm.

18. The method of claim 11 wherein x and y are made to vary as said underlayer is being formed.

19. The method of claim 1 wherein said underlayer is formed by a process comprising:
providing a vacuum deposition chamber that includes a rotatable holder, a sputtering target, an apparatus for injecting a high energy beam of electromagnetic radiation into said chamber, and directing said radiation at said sputtering target, an apparatus for injecting various gases at chosen flow rates and maintaining said gases at a desired concentration ratio within said chamber;
mounting said read/write head, a plurality of such heads or a magnetic disk on said holder and rotating said holder;
directing said radiation at a sputtering target;
injecting $O_2$ gas and $N_2$ gas at a relative concentration ratio respectively while said radiation is impinging on said target, thereby forming said underlayer as an oxynitride on said read/write head, said plurality thereof or said magnetic disk.

20. The method of claim 19 wherein the target comprises Al, an oxide of Al, or a nitride of Al and x is in the range between approximately 0 and 1.5 and y is in the range between approximately 0 and 1.0 and the oxynitride is of the form $AlO_xN_y$.

21. The method of claim 19 wherein the target comprises an alloy of Al in the form $Me_zAl$ where $Me_z$ is an alloying component, or the target comprises an oxide of $Me_zAl$ or a nitride of $Me_zAl$ and the oxynitride is of the form $Me_zAl\,O_xN_y$.

22. The method of claim 21 wherein $Me_z$ is $Ti_z$ and x is in the range between approximately 0 to 1.5+2z, and y is in the range between approximately 0 to 1+z. and z is in the range between approximately 0 to 10.

23. The method of claim 21 wherein $Me_z$ is $Si_z$ and x is in the range between approximately 0 and 1.5+2z, y is in the range between approximately 0 and 1+1.3z. and z is in the range between approximately 0 to 10.

24. The method of claim 21 wherein $Me_z$ is $Cr_z$ and x is in the range between approximately 0 to 1.5+2z, y is in the range between approximately 0 to 1+1.3z. and z is in the range between approximately 0 to 10.

25. The method of claim 19 wherein said radiation is produced by a high energy pulsed $CO_2$ laser or an excimer laser.

26. The method of claim 19 wherein said $O_2$ and $N_2$ gases are injected at flow rates between approximately 0 and 20 sccm.

27. The method of claim 19 wherein x and y are made to vary as said underlayer is being formed.

28. The method of claim 19 wherein said underlayer is formed to a thickness less than approximately 50 angstroms.

29. The method of claim 1 wherein said underlayer is formed by a process comprising:
providing a vacuum deposition chamber that includes a rotatable holder, a sputtering target, an apparatus for injecting a high energy pulsed beam of reactive ions at a chosen energy and directing said ions at said sputtering target, an apparatus for forming a plasma of mixed various gases introduced at chosen flow rates and maintaining said plasma at desired relative concentrations of the plasma gases within said chamber;
mounting said read/write head, said plurality of such heads or said magnetic disk on said holder and rotating said holder;
directing said reactive ions at a sputtering target, producing, thereby, sputtered material from said target;
forming a plasma of $O_2$ gas and $N_2$ gas at a relative concentration ratio x/y,
wherein Ar can be used as the carrier gas for said plasma;
contacting said read/write head, said plurality thereof or said magnetic disk with said plasma while sputtered material from said target impinges thereon or after said sputtered material has impinged thereon, thereby forming said underlayer of an oxynitride on said read/write head, said plurality thereof or said magnetic disk.

30. The method of claim 29 wherein the target comprises Al, an oxide of Al, or a nitride of Al and x is in the range between approximately 0 and 1.5 and y is in the range between approximately 0 and 1.0 and the oxynitride is of the form $AlO_xN_y$.

31. The method of claim 29 wherein the target comprises an alloy of Al in the form $Me_zAl$ where $Me_z$ is an alloying component, or the target comprises an oxide of $Me_zAl$ or a nitride of $Me_zAl$ and the oxynitride is of the form $Me_zAl\,O_xN_y$.

32. The method of claim 31 wherein $Me_z$ is $Ti_z$ and x is in the range between approximately 0 to 1.5+2z, and y is in the range between approximately 0 to 1+z. and z is in the range between approximately 0 to 10.

33. The method of claim 31 wherein $Me_z$ is $Si_z$ and x is in the range between approximately 0 and 1.5+2z, y is in the range between approximately 0 and 1+1.3z. and z is in the range between approximately 0 to 10.

34. The method of claim 31 wherein $Me_z$ is $Cr_z$ and x is in the range between approximately 0 to 1.5+2z, y is in the range between approximately 0 to 1+1.3z. and z is in the range between approximately 0 to 10.

35. The method of claim 31 wherein x and y are made to vary as said underlayer is being formed.

36. The method of claim 31 wherein said underlayer is formed to a thickness less than approximately 50 angstroms.

37. The method of claim 31 wherein said plasma is sequentially applied by $Ar/O_2$ plasma and $Ar/N_2$ plasma at different durations or sequentially applied by $Ar/N_2$ plasma and $Ar/O_2$ plasma at different durations.

38. The method of claim 31 wherein said plasma is an ion beam plasma, an ECR plasma, an ICP, or a CCP.

* * * * *